United States Patent
Lee et al.

(10) Patent No.: US 8,999,526 B2
(45) Date of Patent: Apr. 7, 2015

(54) ORGANIC PHOTOELECTRONIC DEVICE AND IMAGE SENSOR

(75) Inventors: Kwang Hee Lee, Suwon-si (KR); Kyu Sik Kim, Jeonju-si (KR); Kyung Bae Park, Seoul (KR); Dong-Seok Leem, Hwaseong-si (KR); Seon Jeong Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 374 days.

(21) Appl. No.: 13/446,302

(22) Filed: Apr. 13, 2012

(65) Prior Publication Data
US 2013/0112947 A1    May 9, 2013

(30) Foreign Application Priority Data
Nov. 7, 2011    (KR) .................. 10-2011-0115236

(51) Int. Cl.
*H01L 51/54* (2006.01)
*H01L 51/00* (2006.01)
*H01L 51/42* (2006.01)

(52) U.S. Cl.
CPC ........ *H01L 51/0072* (2013.01); *H01L 51/0068* (2013.01); *H01L 51/0074* (2013.01); *H01L 51/4253* (2013.01); *Y10S 428/917* (2013.01)

(58) Field of Classification Search
None
See application file for complete search history.

(56) References Cited

U.S. PATENT DOCUMENTS

| 5,482,570 A | 1/1996 | Saurer et al. |
| 2007/0037012 A1* | 2/2007 | Kim et al. ..................... 428/690 |
| 2007/0137701 A1 | 6/2007 | Sainte Catherine et al. |

FOREIGN PATENT DOCUMENTS

| JP | 2007527107 A | 9/2007 |

OTHER PUBLICATIONS

J. Chen et al., "Quinacridone-Based Molecular Donors for Solution Processed Bulk-Heterojunction Organic Solar Cells", ACS Applied Materials & Interfaces, 2010, pp. 2679-2686.
H. Seo et al., "Color Sensors with Three Vertically Stacked Organic Photodetectors", Japanese Journal of Applied Physics, 2007, pp. L1240-L1242, vol. 46, No. 49.
S. Aihara et al., "Stacked Image Sensor with Green- and Red-Sensitive Organic Photoconductive Films Applying Zinc Oxide Thin-Film Transistors to a Signal Readout Circuit", IEEE Transactions on Electron Devices, Nov. 2009, pp. 2570-2576, vol. 56, No. 11.
M. Ihama et al., "CMOS Image Sensor with a Thin Overlaid Panchromatic Organic Photoconductive Layer for Sensors with Reduced Pixel Size", IDW, INP 1-4, 2009, pp. 2123-2126.

* cited by examiner

*Primary Examiner* — Gregory Clark
(74) *Attorney, Agent, or Firm* — Harness, Dickey & Pierce, P.L.C.

(57) ABSTRACT

An organic photoelectric device may include an anode and a cathode configured to face each other, and an active layer between the anode and cathode, wherein the active layer includes a quinacridone derivative and a thiophene derivative having a cyanovinyl group.

21 Claims, 9 Drawing Sheets

ORGANIC PHOTOELECTRONIC DEVICE AND IMAGE SENSOR

CROSS-REFERENCE TO RELATED APPLICATION

This application claims priority to and the benefit of Korean Patent Application No. 10-2011-0115236 filed in the Korean Intellectual Property Office on Nov. 7, 2011, the entire contents of which are incorporated herein by reference.

BACKGROUND

1. Field

Example embodiments provide an organic photoelectric device and an image sensor including the same.

2. Description of the Related Art

A photoelectric device is a device for converting light into an electrical signal using photoelectric effects. The photoelectric device includes a photodiode and/or a photo-transistor, and may be applied to an image sensor and/or a solar cell.

An image sensor including a photodiode may provide for more improved resolution over time, and thus requires a smaller pixel size. A currently used silicon photodiode has many smaller absorption areas due to the smaller pixel size, and thus may deteriorate sensitivity. Accordingly, an organic material has been researched to replace silicon.

The organic material has a higher absorption coefficient and selectively absorbs light in a particular wavelength region according to the organic molecular structure, and thus may replace both a photodiode and a color filter, which results in improved sensitivity and higher integration.

SUMMARY

Example embodiments provide an organic photoelectric device selectively absorbing light in a green wavelength region and improving efficiency. Example embodiments also provide an image sensor including the organic photoelectric device.

According to example embodiments, an organic photoelectric device may include an anode and a cathode configured to face each other and an active layer between the anode and cathode, wherein the active layer includes a quinacridone derivative and a thiophene derivative having a cyanovinyl group.

The quinacridone derivative may be represented by the following Chemical Formula 1.

[Chemical Formula 1]

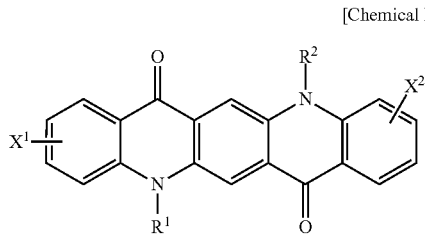

In Chemical Formula 1, each of $R^1$ and $R^2$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof, and each of $X^1$ and $X^2$ are independently one of hydrogen and a substituted or unsubstituted $C_3$ to $C_{30}$ heterocyclic aromatic group.

Each of $X^1$ and $X^2$ may be independently selected from groups listed in the following Group 1.

[Group 1]

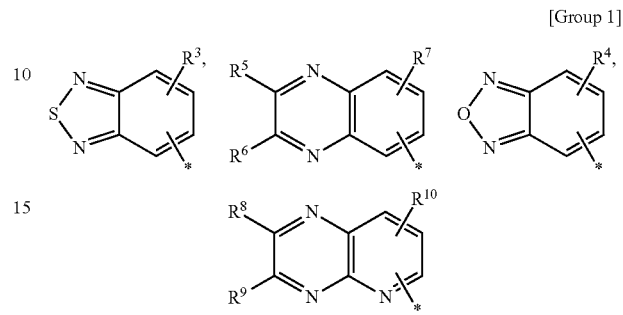

In Group 1, each of $R^3$ to $R^{10}$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

The quinacridone derivative may include at least one selected from compounds represented by the following Chemical Formulas 1a to 1e.

[Chemical Formula 1a]

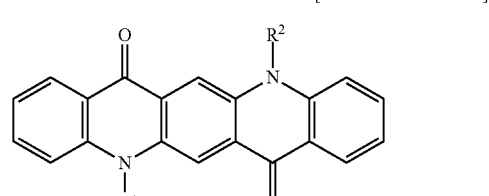

[Chemical Formula 1b]

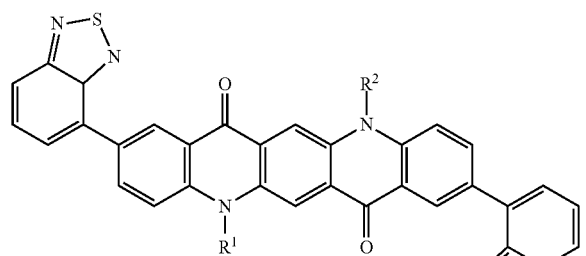

[Chemical Formula 1c]

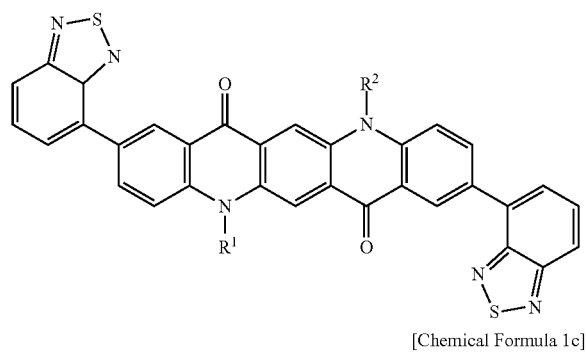

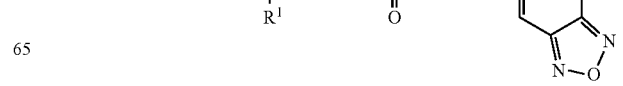

-continued

[Chemical Formula 1d]

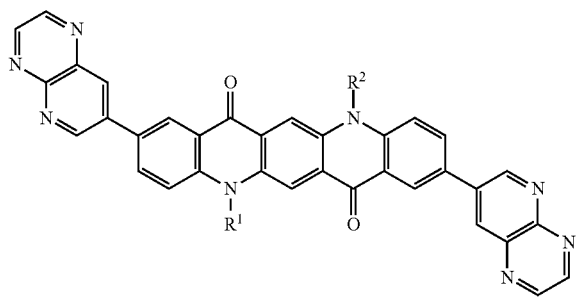

[Chemical Formula 1e]

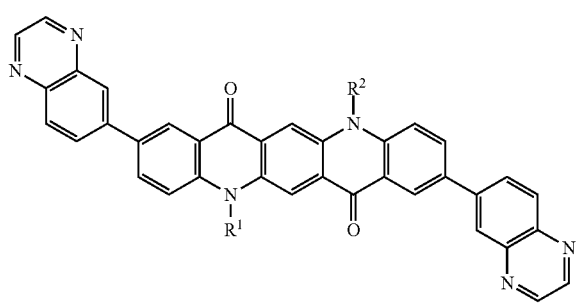

In Chemical Formulas 1a to 1e, each of $R^1$ and $R^2$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

The thiophene derivative may be represented by the following Chemical Formula 2.

[Chemical Formula 2]

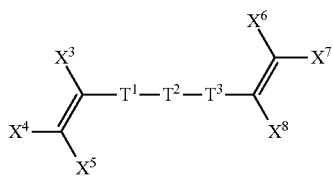

In Chemical Formula 2, each of $T^1$, $T^2$, and $T^3$ are independently an aromatic ring having a substituted or unsubstituted thiophene moiety, each of $X^3$ to $X^6$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a cyano group, and a combination thereof, at least one of $X^3$ to $X^8$ is a cyano group, and each of $T^1$, $T^2$, and $T^3$ may be independently selected from groups listed by the following Group 2.

[Group 2]

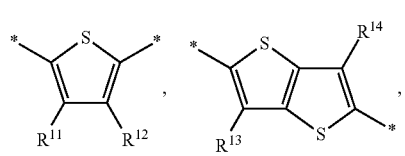

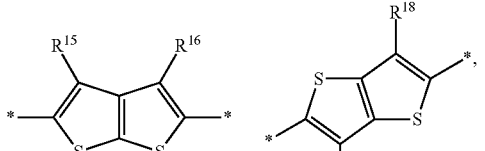

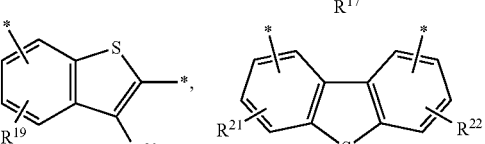

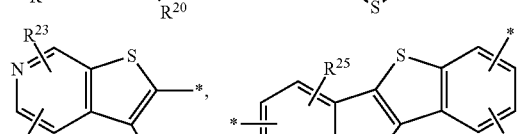

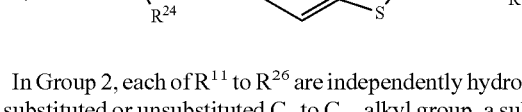

In Group 2, each of $R^{11}$ to $R^{26}$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

The thiophene derivative may be at least one selected from compounds represented by the following Chemical Formulas 2a to 2c.

[Chemical Formula 2a]

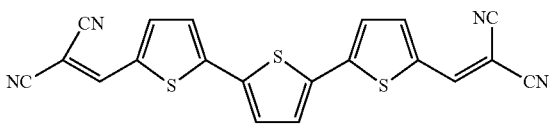

[Chemical Formula 2b]

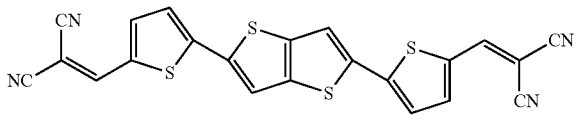

[Chemical Formula 2c]

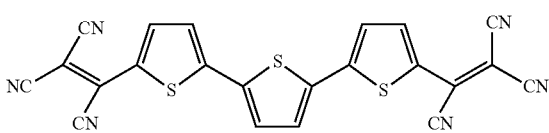

The active layer may have a maximum absorption peak in a wavelength region ranging from about 500 nm to about 600 nm.

The quinacridone derivative and the thiophene derivative having a cyanovinyl group may respectively have a bandgap ranging from about 2.0 eV to 2.5 eV.

The quinacridone derivative and the thiophene derivative having a cyanovinyl group may have a lowest unoccupied molecular orbital (LUMO) difference ranging from about 0.2 eV to about 0.7 eV.

The active layer may include the quinacridone derivative and the thiophene derivative having a cyanovinyl group in various ratios depending on their position in relation to the cathode and the anode.

The active layer may include a greater amount of the quinacridone derivative when located closer to the anode. In addition, the active layer may include a greater amount of the thiophene derivative having a cyanovinyl group when located closer to the cathode.

The quinacridone derivative and the thiophene derivative having a cyanovinyl group may be included in a ratio ranging from about 1:100 to about 100:1. The active layer may have a thickness ranging from about 1 nm to about 500 nm.

The organic photoelectric device may further include a p-type layer between the anode and the active layer and including the quinacridone derivative.

The organic photoelectric device may further include an n-type layer between the cathode and the active layer and including the thiophene derivative having a cyanovinyl group.

According to example embodiments, an image sensor may include the organic photoelectric device.

According to example embodiments, an active layer for an organic photoelectric device may include a quinacridone derivative and a thiophene derivative having a cyanovinyl group.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
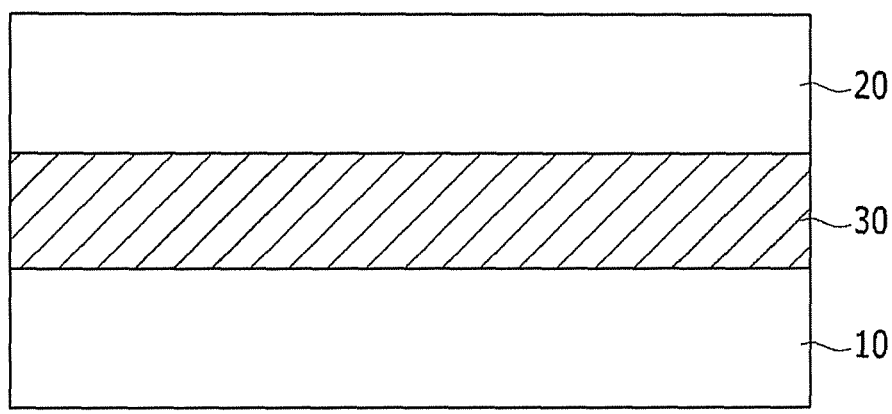
FIG. 1 is a schematic cross-sectional view showing an organic photoelectric device according to example embodiments.

The present disclosure will be described more fully hereinafter with reference to the accompanying drawings, in which example embodiments are shown. As those skilled in the art would realize, example embodiments may be modified in various different ways, all without departing from the spirit or scope of this disclosure.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, when a specific definition is not otherwise provided, the term "substituted" refers to one substituted with at least one substituent selected from a halogen (F, Br, Cl, or I), a hydroxyl group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a $C_1$ to $C_{20}$ alkyl group, a $C_2$ to $C_{20}$ alkenyl group, a $C_2$ to $C_{20}$ alkynyl group, a $C_6$ to $C_{30}$ aryl group, a $C_7$ to $C_{30}$ arylalkyl group, a $C_1$ to $C_4$ alkoxy group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a $C_2$ to $C_{20}$ heterocycloalkyl group, and a combination thereof in place of at least one hydrogen of a compound.

As used herein, when a definition is not otherwise provided, the prefix "hetero" may refer to one including 1 to 3 heteroatoms selected from N, O, S, and P.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 is a schematic cross-sectional view showing an organic photoelectric device according to example embodiments. Referring to FIG. 1, an organic photoelectric device may include an anode 10 and a cathode 20 configured to face each other, and an active layer 30 between the anode 10 and the cathode 20. FIG. 1 shows that the anode 10 is disposed under the active layer 30 and that the cathode 20 is disposed on the active layer 30. However, the cathode 20 may be disposed under the active layer 30, while the anode 10 may be disposed on the active layer 30.

One of the anode 10 and the cathode 20 may be made of, for example, a transparent conductor, e.g., indium tin oxide (ITO) and indium zinc oxide (IZO), and the other may be made of, for example, an opaque conductor, e.g., aluminum (Al).

The active layer 30 is a layer forming a pn junction including a mixture of p-type and n-type semiconductor materials, and receives external light, generates excitons, and separates the excitons into holes and electrons.

The active layer 30 includes a quinacridone derivative and a thiophene derivative having a cyanovinyl group. The quinacridone derivative is a p-type semiconductor material, while the thiophene derivative is an n-type semiconductor material.

The quinacridone derivative may be represented by the following Chemical Formula 1.

[Chemcial Formula 1]

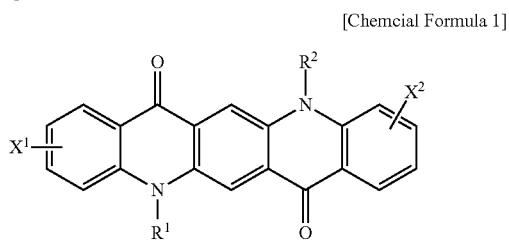

In Chemical Formula 1, each of $R^1$ and $R^2$ may be independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof, and each of $X^1$ and $X^2$ are independently one of hydrogen and a substituted or unsubstituted $C_3$ to $C_{30}$ heterocyclic aromatic group. $X^1$ and $X^2$ may be each independently selected from groups listed in the following Group 1.

[Group 1]

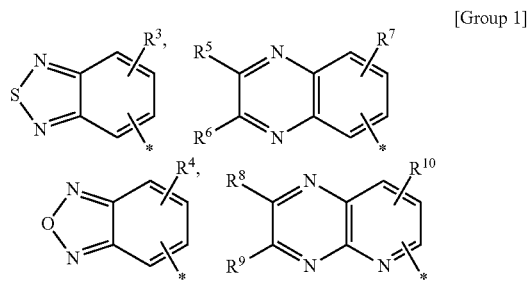

In Group 1, each of $R^3$ to $R^{13}$ may be independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof. The symbol "*" refers to a portion connected to a carbon of a cyclic portion in Chemical Formula 1.

The quinacridone derivative may include at least one selected from the compounds represented by the following Chemical Formulas 1a to 1e.

[Chemical Formula 1a]

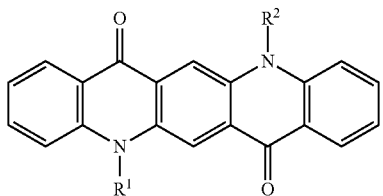

[Chemical Formula 1b]

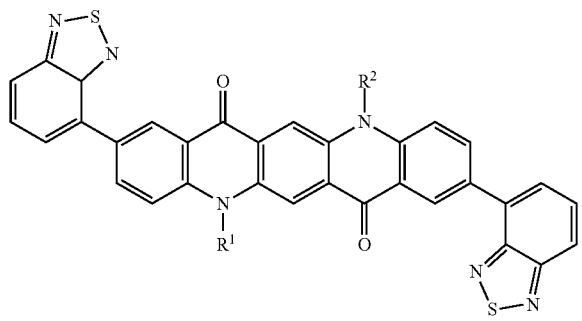

[Chemical Formula 1c]

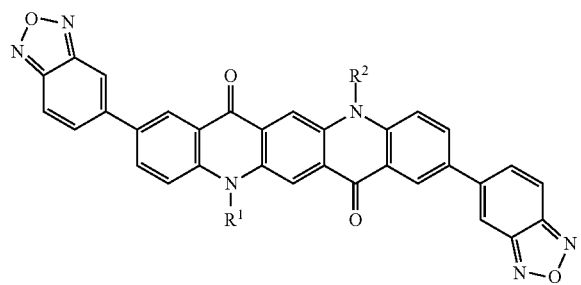

[Chemical Formula 1d]

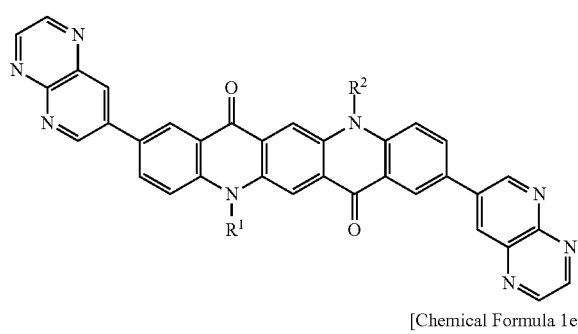

[Chemical Formula 1e]

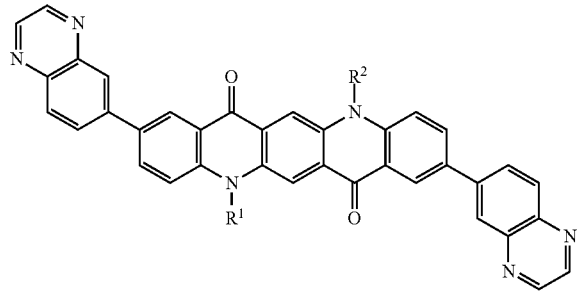

In Chemical Formulas 1a to 1e, each of $R^1$ and $R^2$ may be the same as described above.

The thiophene derivative may be represented by the following Chemical Formula 2.

[Chemical Formula 2]

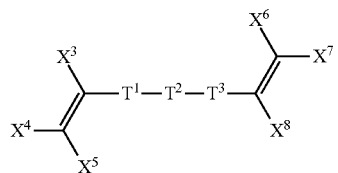

In Chemical Formula 2, each of $T^1$, $T^2$, and $T^3$ may be independently an aromatic ring having a substituted or unsubstituted thiophene moiety. Each of $T^1$, $T^2$, and $T^3$ may be independently selected from groups listed in the following Group 2.

[Group 2]

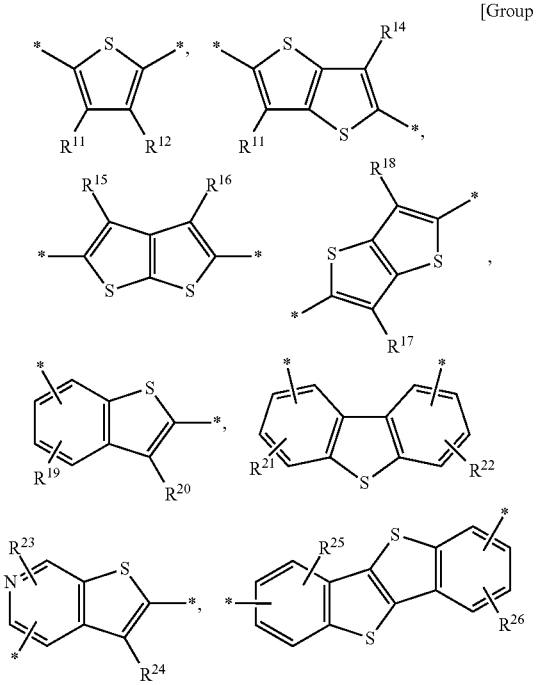

In Group 2, each of $R^{11}$ to $R^{26}$ may be independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof. Each of $X^3$ to $X^8$ may be independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a cyano group, and a combination thereof, provided that at least one of $X^3$ to $X^6$ is a cyano group.

The thiophene derivative may be at least one selected from the compounds represented by the following Chemical Formulas 2a to 2c.

[Chemical Formula 2a]

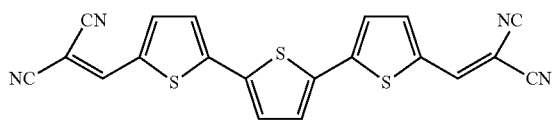

[Chemical Formula 2b]

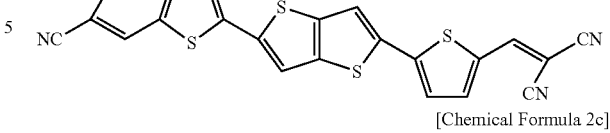

[Chemical Formula 2c]

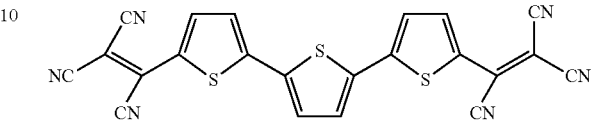

The quinacridone derivative and the thiophene derivative having a cyanovinyl group may respectively have a bandgap ranging from about 1.5 eV to about 3.5 eV. Within the range, the quinacridone derivative and the thiophene derivative having a cyanovinyl group each may have a bandgap ranging from about 2.0 eV to about 2.5 eV. The p-type and n-type semiconductor materials in the active layer respectively having a bandgap within the range that may absorb light in a green wavelength region, and specifically, may have a maximum absorption peak in a wavelength region ranging from about 500 nm to about 600 nm.

The quinacridone derivative and the thiophene derivative having a cyanovinyl group may have a LUMO energy level difference ranging from about 0.2 eV to about 0.7 eV. Within the range, the quinacridone derivative and the thiophene derivative having a cyanovinyl group may have a LUMO energy level difference ranging from about 0.3 eV to about 0.5 eV. The p-type and n-type semiconductor materials in the active layer have a LUMO energy level difference within the range, and thus effectively adjust external quantum efficiency (EQE) depending on a bias applied to a device, as well as improve external quantum efficiency (EQE) thereof.

The quinacridone derivative and the thiophene derivative having a cyanovinyl group may be included in a ratio ranging from about 1:100 to about 100:1. Within the range, the quinacridone derivative and the thiophene derivative having a cyanovinyl group may be included in a ratio ranging from about 1:50 to about 50:1, for example, in a ratio ranging from about 1:10 to about 10:1, or in a ratio ranging from about 1:1. The p-type and n-type semiconductor materials in the active layer are composed in a ratio within the range, and thus effectively generate excitons and form a pn junction. The quinacridone derivative and the thiophene derivative may be uniformly included in the active layer 30, regardless of their respective positions in the active layer 30.

Alternatively, the quinacridone derivative and the thiophene derivative may be included in the active layer 30 in various ratios depending on the position of the active layer 30. For example, the active layer 30 may include a greater amount of the quinacridone derivative as a p-type semiconductor material when located closer to the anode 10, and more of the thiophene derivative having a cyanovinyl group as a n-type semiconductor material when located closer to the cathode 20. Herein, a composition ratio between the quinacridone derivative and the thiophene derivative may keep changing in a thickness direction continuously or in a stepwise form.

The active layer 30 may have a thickness ranging from about 1 nm to about 500 nm. Within the range, the active layer 30 may have a thickness ranging from about 5 nm to about 300 nm. The active layer 30 has a thickness within the range, and thus may effectively absorb a light and then effectively separate a hole and an electron from an exciton and transfer the electron, which effectively improves photoelectric conversion efficiency.

As shown in FIG. 1, an organic photoelectric device receives a light from the anode 10 and/or cathode 20, and then the active layer 30 absorbs light in a green wavelength region and may generate excitons therein. The excitons may be separated into holes and electrons in the active layer 30, and the holes move toward the anode 10 while the electrons move toward the cathode 30, thereby making a current flow in the organic photoelectric device.

Herein, an auxiliary layer (not shown) between the anode 10 and the active layer 30 and/or between the cathode 20 and the active layer 30 may be further included to facilitate transportation of the hole and the electron in the active layer 30.

The auxiliary layer may include at least one selected from a hole transport layer (HTL), an electron blocking layer (EBL), an electron transport layer (ETL), and a hole blocking layer (HBL).

The hole transporting layer (HTL) may facilitate the transportation of holes, and may include one selected from poly (3,4-ethylene dioxythiophene):poly(styrene sulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), and a combination thereof, without limitation.

The electron blocking layer (EBL) may prohibit the transportation of electrons, and may include one selected from poly(3,4-ethylene dioxythiophene):poly(styrene sulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), and a combination thereof, without limitation.

The electron transport layer (ETL) may facilitate the transportation of electrons, and may include one selected from 1,4,5,8-naphthalene-tetracarboxylic dianhydride (NTCDA), bathocuproine (BCP), LiF, Alq3, Gaq3, Inq3, Znq2, Zn(BTZ)2, BeBq2, and a combination thereof, without limitation.

The hole blocking layer (HBL) may prohibit transportation of holes, and may include one selected from 1,4,5,8-naphthalene-tetracarboxylic dianhydride (NTCDA), BCP, LiF, Alq3, Gaq3, Inq3, Znq2, Zn(BTZ)2, BeBq2, and a combination thereof, without limitation.

When an organic photoelectric device according to example embodiments is applied to, for example, an image sensor, the organic photoelectric device may simultaneously replace a color filter, which is desirable for higher integration.

Figure 2:
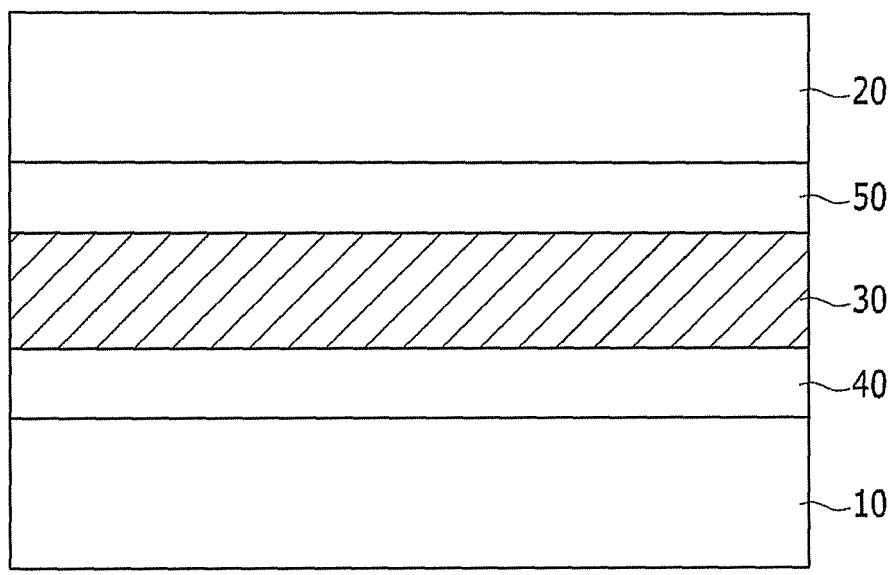
FIG. 2 is a schematic cross-sectional view showing an organic photoelectric device according to example embodiments.

FIG. 2 is a schematic cross-sectional view showing an organic photoelectric device according to example embodiments. Referring to FIG. 2, the organic photoelectric device may include an anode 10, a cathode 20, and an active layer 30, like the aforementioned organic photoelectric device.

However, the organic photoelectric device according to example embodiments may further include a p-type layer 40 between the anode 10 and the active layer 30 and an n-type layer 50 between the cathode 20 and the active layer 30, unlike the aforementioned organic photoelectric device.

The p-type layer 40 is where holes separated from excitons generated in the active layer 30 may be transported, and may include the aforementioned quinacridone derivative.

The n-type layer 50 is where electrons separated from excitons generated in the active layer 30 is transported, and may further include the aforementioned thiophene derivative having a cyanovinyl group.

An organic photoelectric device including both the p-type layer 40 and the n-type layer 50 is shown in the drawing, but is not limited thereto, and may include either one of the p-type layer 40 and the n-type layer 50. For example, when the n-type layer 50 is omitted, the anode 10, the p-type layer 40, the active layer 30, and the cathode 20 may be laminated. On the other hand when the p-type layer 40 is omitted, the anode 10, the active layer 30, the n-type layer 50, and the cathode 20 may be laminated.

According to example embodiments, the aforementioned auxiliary layer may be further included between the anode 10 and the p-type layer 40 and/or between the cathode 20 and the n-type layer 50.

The organic photoelectric device may be applied to a solar cell, an image sensor, a photodetector, a photosensor, and/or an organic light emitting diode (OLED), but is not limited thereto.

When the organic photoelectric device is applied to an image sensor, the organic photoelectric device may also replace a color filter with green pixels, which is particularly desirable for higher integration.

The image sensor includes a pixel array including a plurality of pixels arranged in a matrix type. Each pixel may include the aforementioned organic photoelectric device. The aforementioned organic photoelectric device may be a device sensing light and transporting the sensed information to a transportation transistor.

The following examples are example embodiments for illustrating this disclosure in more detail, but do not limit the inventive concepts.

Absorption Characteristic of Quinacridone Derivative

N,N-dimethylquinacridone (NNQA) represented by the following Chemical Formula 1a', N,N-dimethylquinacridone-thiadiazole (NNQA-Td) represented by the following Chemical Formula 1b', N,N-dimethylquinacridone-oxadiazole (NNQA-OD) represented by the following Chemical Formula 1c', N,N-dimethylquinacridone-pyrazine (NNQA-PZ) represented by the following Chemical Formula 1d', and N,N-dimethyl quinacridone quinoxaline (NNDQ-QX) represented by the following Chemical Formula 1e' are respectively prepared.

[Chemical Formula 1a']

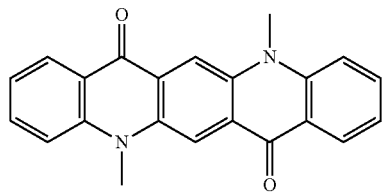

-continued

[Chemical Formula 1b']

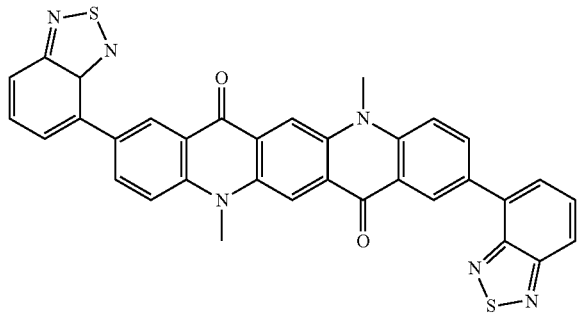

[Chemical Formula 1c']

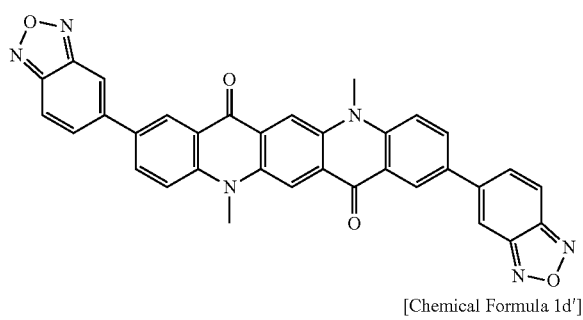

[Chemical Formula 1d']

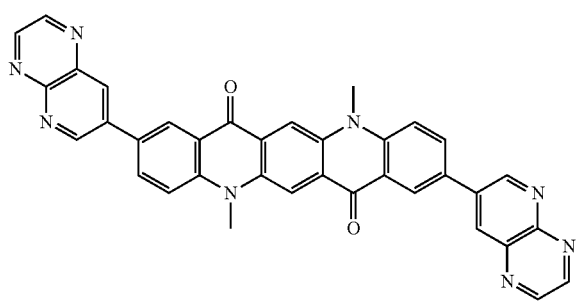

[Chemical Formula 1e']

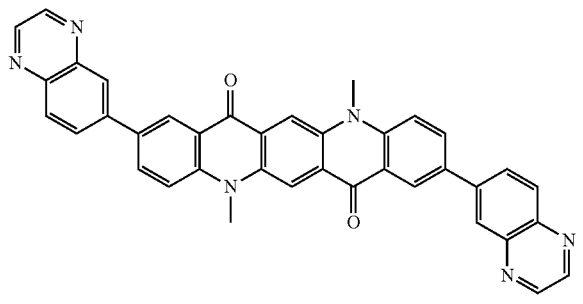

The quinacridone derivatives represented by the above Chemical Formulas 1a' to 1e' are evaluated for their light absorption characteristic depending on a wavelength. The light absorption characteristic may be evaluated by using Cary 5000 UV spectroscopy (Varian, Inc.) and radiating ultraviolet-visible (UV-Vis) rays.

Figure 3:
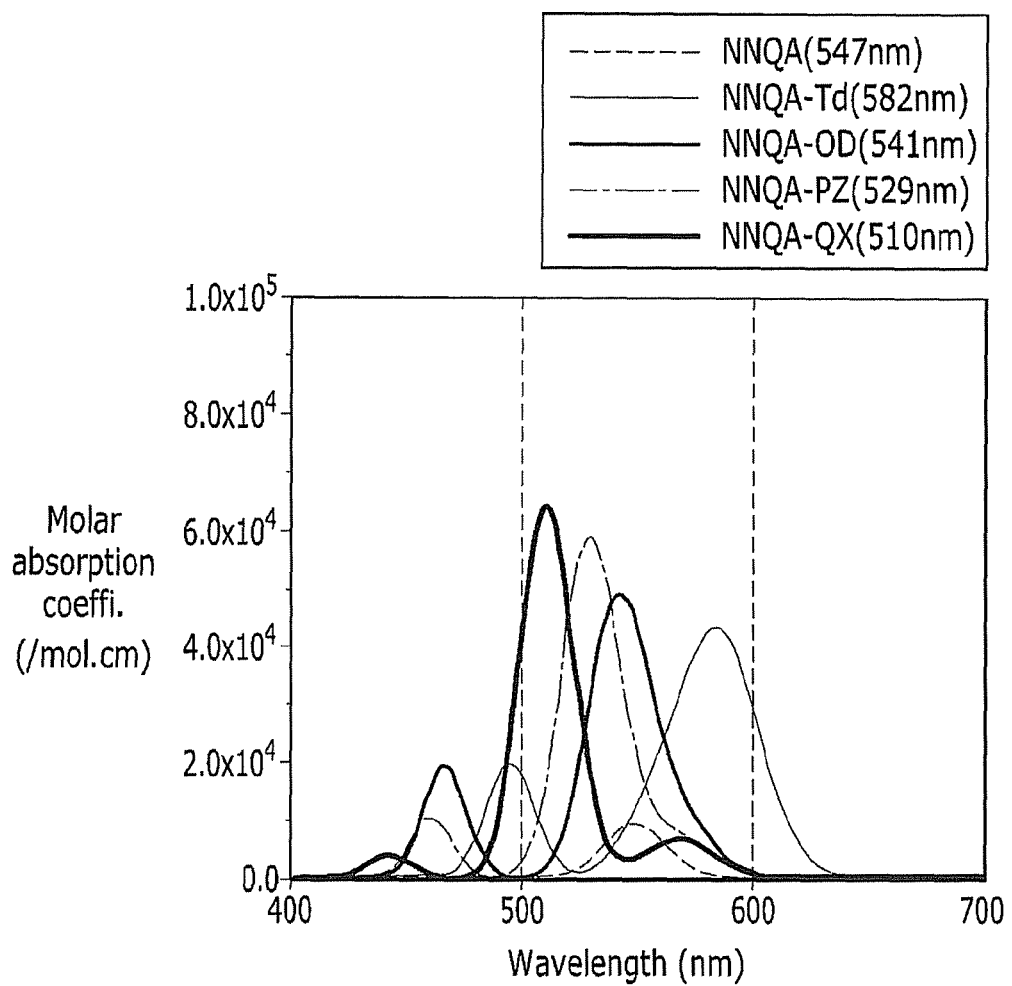
FIG. 3 is a graph showing the absorption coefficient of an organic photoelectric device depending on wavelength of a quinacridone derivative represented by Chemical Formulas 1a' to 1e'.

FIG. 3 is a graph showing the absorption coefficient of quinacridone derivatives represented by Chemical Formulas 1a' to 1e' depending on a wavelength.

Referring to FIG. 3, the quinacridone derivatives represented by the above Chemical Formulas 1a' to 1e' may have a maximum absorption peak in a wavelength region ranging from about 500 nm to about 600 nm, and may selectively absorb light in a green wavelength region. In addition, the quinacridone derivatives have a sharper peak in the wavelength region, and improve sensitivity and color purity.

Absorption Characteristic of Thiophene Derivative

Dicyanovinyl terthiophene (DCV3T) represented by the above Chemical Formula 2a, dicyanovinyl terthienothiophene (DCV3TT) represented by the above Chemical Formula 2b, and tercyanovinyl-terthiophene (TCV3T) represented by the above Chemical Formula 2c are prepared respectively, and evaluated their absorption characteristic depending on wavelengths.

Figure 4:
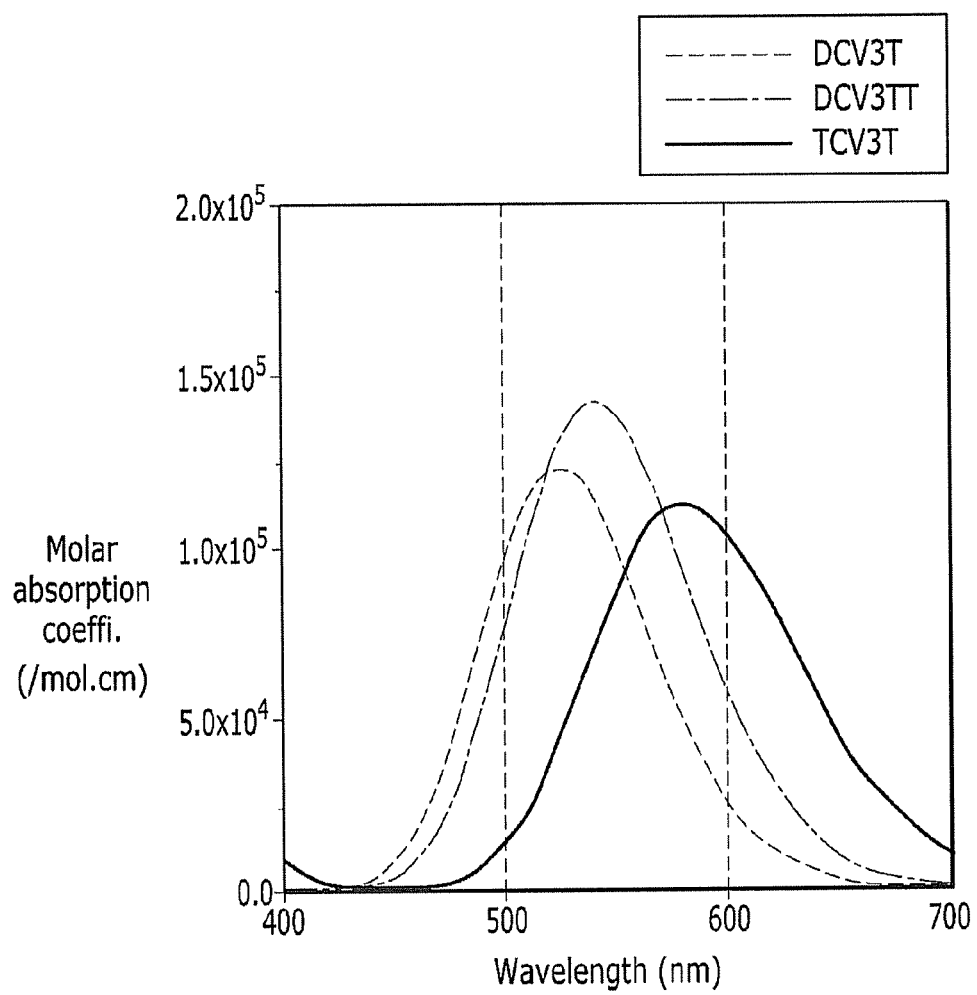
FIG. 4 is a graph showing the absorption coefficient of an organic photoelectric device depending on wavelengths of thiophene derivatives represented by Chemical Formulas 2a to 2c.

FIG. 4 is a graph showing absorption coefficients of the thiophene derivatives represented by Chemical Formulas 2a to 2c depending on a wavelength.

Referring to FIG. 4, the thiophene derivatives represented by the above Chemical Formulas 2a to 2c' have a maximum absorption peak in a wavelength region ranging from about 500 nm to about 600 nm, and selectively absorb light in a green wavelength region.

Fabrication of Organic Photoelectric Device

Example 1

ITO is sputtered on a glass substrate to form an approximately 100 nm thick anode, and a dimethylquinacridone compound represented by the above Chemical Formula 1a' as a p-type semiconductor material is thermally deposited thereon to form a 30 nm-thick p-type layer. A dimethylquinacridone compound above Chemical Formula 1a' as a p-type semiconductor material and a dicyanovinyl-terthiophene compound represented by the above Chemical Formula 2a as an n-type semiconductor material are co-deposited in a ratio of about 1:1 to form a 70 nm-thick active layer, and a dicyanovinyl-terthiophene compound represented the following Chemical Formula 2a as an n-type semiconductor material is thermally deposited thereon to form a 30 nm-thick n-type layer. Aluminum (Al) is sputtered on the n-type layer to form an 80 nm-thick cathode, finally fabricating an organic photoelectric device.

Comparative Example 1

An organic photoelectric device is fabricated according to the same method as Example 1, except for using fullerene (C60) instead of the dicyanovinylthiophene compound represented by the above Chemical Formula 2a as an n-type semiconductor material.

Comparative Example 2

An organic photoelectric device is fabricated according to the same method as Example 1, except for using zinc phthalocyanone (ZnPc) instead of the dimethylquinacridone compound represented by the above Chemical Formula 1a' as a p-type semiconductor material.

Evaluation-1

The organic photoelectric devices according to Example 1 and Comparative Examples 1 and 2 are evaluated for external quantum efficiency (EQE) depending on wavelengths.

The external quantum efficiency is measured using an IPCE measurement system (McScience Co., Ltd., Korea). The IPCE measurement system is calibrated using a Si photodiode (Hamamatsu Co., Japan), and then mounted on the organic photoelectric devices according to Example 1 and Comparative Examples 1 and 2. The organic photoelectric devices are measured for external quantum efficiency in a wavelength region ranging from about 350 nm to about 800 nm.

Figure 5:
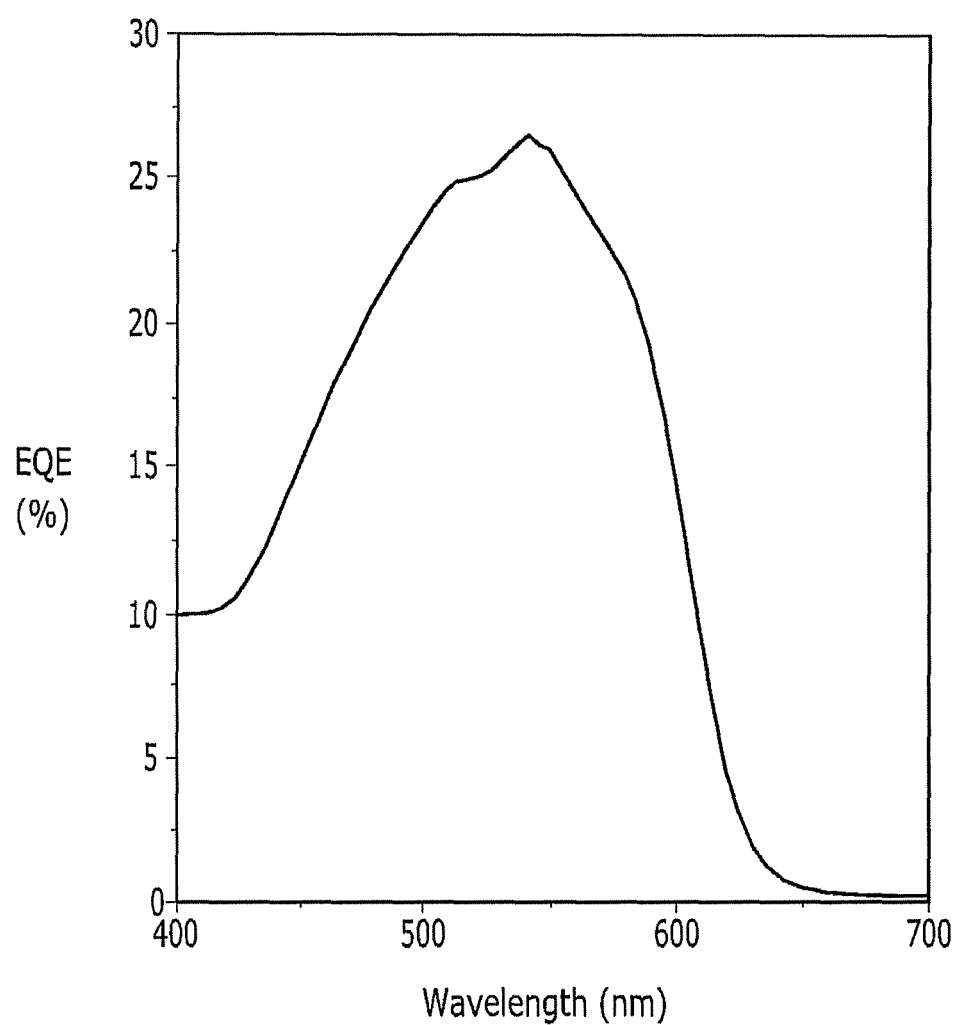
FIGS. 5 to 7 are graphs respectively showing external quantum efficiency of the organic photoelectric devices according to Example 1 and Comparative Examples 1 and 2 depending on wavelengths of the organic photoelectric devices.
Figure 6:
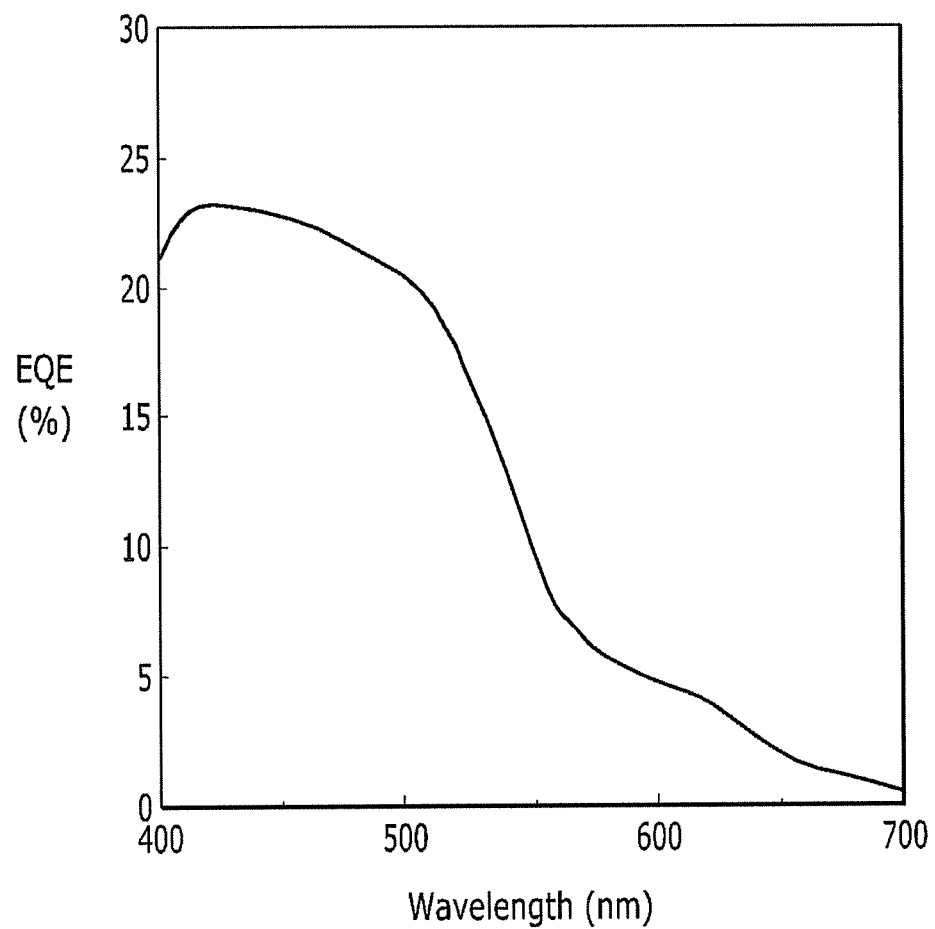
Figure 7:
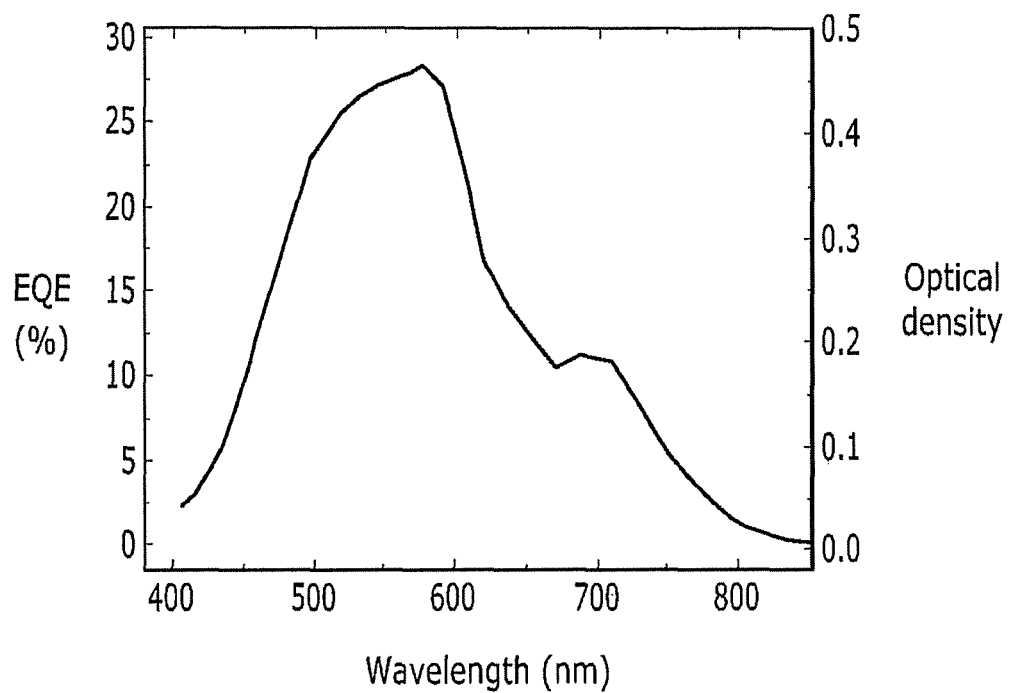

FIGS. 5 to 7 are graphs respectively showing external quantum efficiency of the organic photoelectric devices according to Example 1 and Comparative Examples 1 and 2 depending on wavelengths.

Referring to FIG. 5, the organic photoelectric device according to Example 1 has a maximum external quantum efficiency (EQE) peak in a green wavelength region ranging from about 500 nm to about 600 nm, and about 25% external quantum efficiency (EQE) at a wavelength region of about 540 nm.

On the contrary, referring to FIG. 6, the organic photoelectric device according to Comparative Example 1 has no maximum external quantum efficiency (EQE) green wavelength region in a green wavelength region ranging from about 500 nm to about 600 nm, and further has seriously deteriorated external quantum efficiency (EQE) in the wavelength region. Because C60 as an n-type material has an absorption wavelength region distributed all over the ultraviolet (UV) and visible light regions, the organic photoelectric device according to Comparative Example 1 has deteriorated solar energy conversion efficiency by light absorbed in the region.

Referring to FIG. 7, the organic photoelectric device according to Comparative Example 2 has a maximum external quantum efficiency (EQE) peak in a green wavelength region ranging from about 500 nm to about 600 nm, but absorbs light in a red region due to CuPc used as a p-type material and having a wavelength region ranging from about 600 nm to about 700 nm. Comparative Example 2 results in solar energy conversion efficiency in the region, which is opposite to the result of the organic photoelectric device according to Example 1 selectively absorbing green light.

Evaluation-2

The organic photoelectric device according to Example 1 is applied with various biases and measured regarding current density and external quantum efficiency (EQE).

Figure 8:
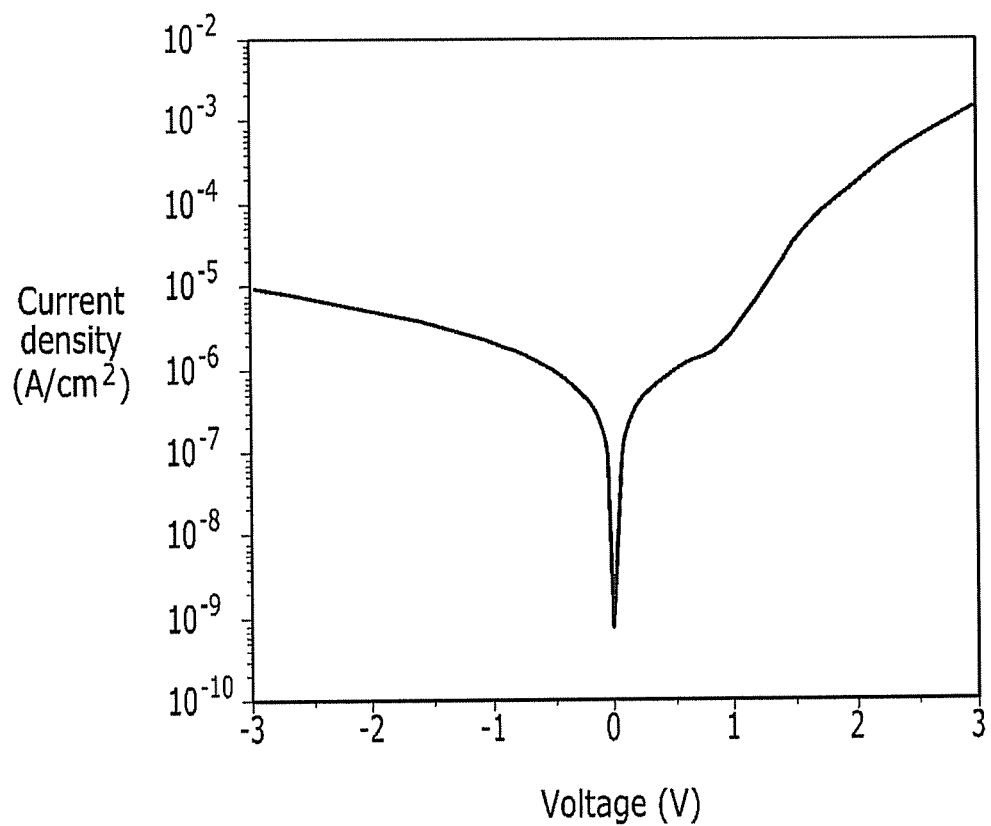
FIG. 8 is a graph showing current density of the organic photoelectric device according to Example 1 depending on voltage.

FIG. 8 provides a graph showing current density of the organic photoelectric device of Example 1 depending on voltages. Referring to FIG. 8, the organic photoelectric device of Example 1 has a diode characteristic in which a current is suppressed from flowing in a reverse voltage direction.

Figure 9:
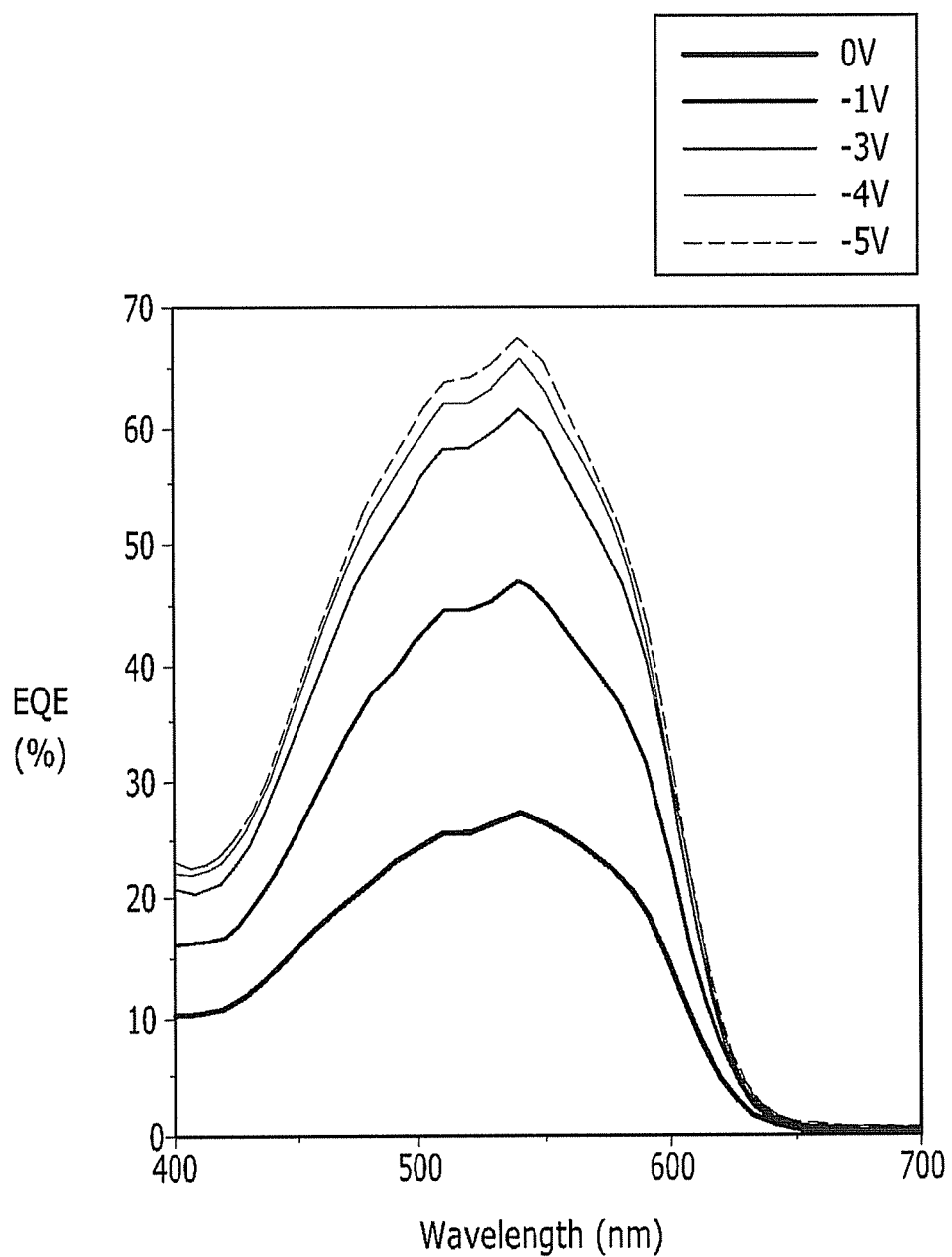
FIG. 9 is a graph showing external quantum efficiency of the organic photoelectric device according to Example 1 depending on its voltage.

FIG. 9 is a graph showing external quantum efficiency change of the organic photoelectric device of Example 1 when applied with a voltage. Referring to FIG. 9, when the organic photoelectric device of Example 1 applied a voltage of up to about −5 V, the organic photoelectric device has about 65% increased efficiency without any change in the external quantum efficiency graph and has efficiency of greater than or equal to about 60% at a low voltage of about −3 V. Accordingly, the organic photoelectric device of Example 1 may be appropriately used for a sensor for amplifying a fine signal by applying a voltage thereto.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An organic photoelectric device, comprising:
    an anode and a cathode configured to face each other; and
    an active layer between the anode and cathode, the active layer including a quinacridone derivative represented by the following Chemical Formula 1 and a thiophene derivative having a cyanovinyl group:

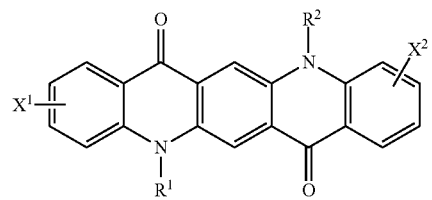

[Chemical Formula 1]

wherein, in Chemical Formula 1,
    each of $R^1$ and $R^2$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof, and
    each of $X^1$ and $X^2$ are independently one of hydrogen and a substituted or unsubstituted $C_3$ to $C_{30}$ heterocyclic aromatic group, at least one of $X^1$ and $X^2$ being a substituted or unsubstituted $C_3$ to $C_{30}$ heterocyclic aromatic group.

2. The organic photoelectric device of claim 1, wherein each of $X^1$ and $X^2$ are independently selected from groups listed in the following Group 1:

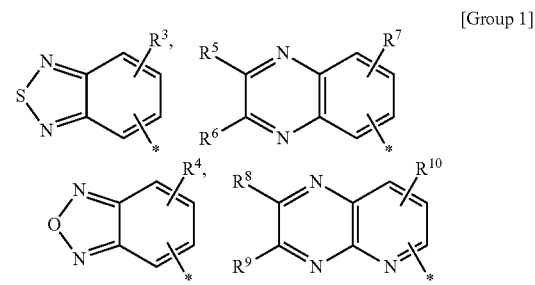

[Group 1]

wherein, in Group 1,
    each of $R^3$ to $R^{10}$ are independently one of hydrogen, a substituted or unsubstituted C1 to $C_{30}$ alkyl group, a substituted or unsubstituted $C_6$ to $C_{30}$ aryl group, a substituted or unsubstituted $C_3$ to $C_{30}$ heteroaryl group, and a combination thereof.

3. The organic photoelectric device of claim 1, wherein the quinacridone derivative includes at least one selected from compounds represented by the following Chemical Formulas 1b to 1e:

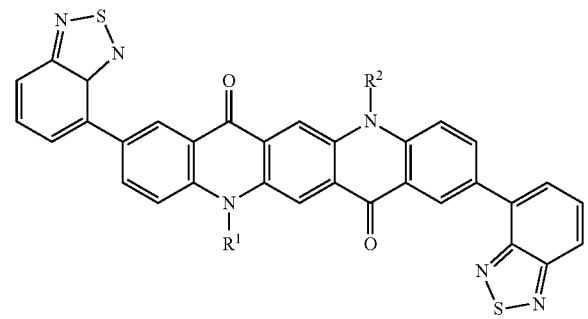

[Chemical Formula 1b]

-continued

[Chemical Formula 1c]

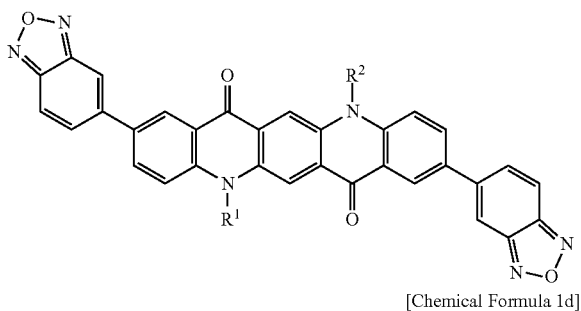

[Chemical Formula 1d]

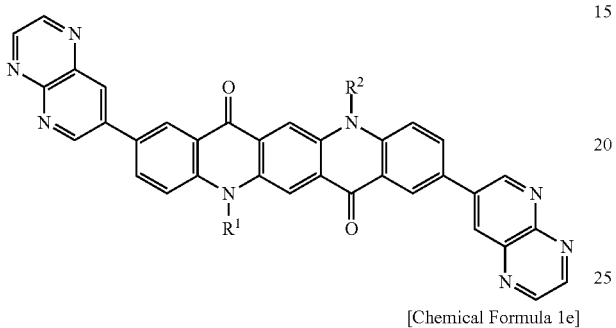

[Chemical Formula 1e]

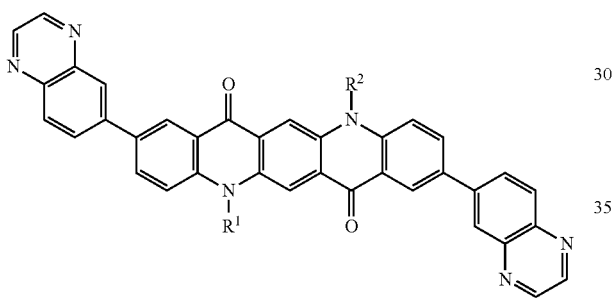

wherein, in Chemical Formulas 1b to 1e, each of $R^1$ and $R^2$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

4. The organic photoelectric device of claim 1, wherein the thiophene derivative is represented by the following Chemical Formula 2:

[Chemical Formula 2]

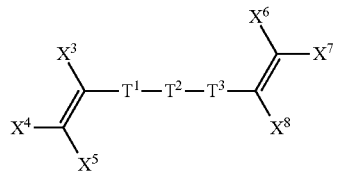

wherein, in Chemical Formula 2, each of $T^1$, $T^2$, and $T^3$ are independently one of an aromatic ring having a substituted or unsubstituted thiophene moiety, each of $X^3$ to $X^8$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a cyano group, and a combination thereof, and at least one of $X^3$ to $X^8$ is a cyano group.

5. The organic photoelectric device of claim 4, wherein each of $T^1$, $T^2$, and $T^3$ are independently selected from groups listed in the following Group 2:

[Group 2]

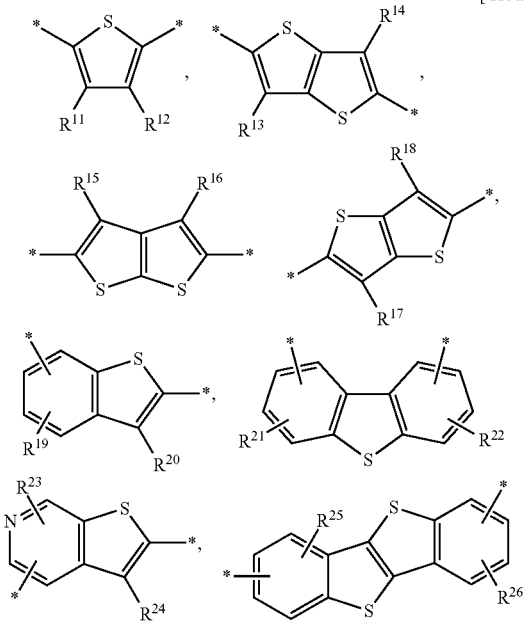

wherein, in Group 2, each of $R^{11}$ to $R^{26}$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

6. The organic photoelectric device of claim 4, wherein the thiophene derivative includes at least one selected from compounds represented by the following Chemical Formulas 2a to 2c:

[Chemical Formula 2a]

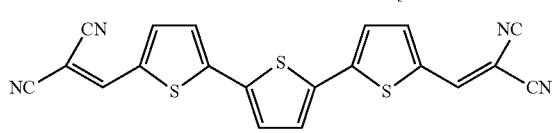

[Chemical Formula 2b]

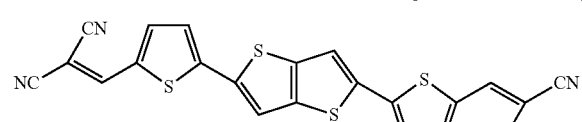

[Chemical Formula 2c]

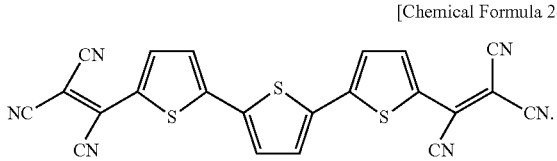

7. The organic photoelectric device of claim 1, wherein the active layer has a maximum absorption peak in a wavelength region ranging from about 500 nm to about 600 nm.

8. The organic photoelectric device of claim 1, wherein the quinacridone derivative and the thiophene derivative having a cyanovinyl group each have a bandgap ranging from about 2.0 eV to about 2.5 eV.

9. The organic photoelectric device of claim 1, wherein the quinacridone derivative and the thiophene derivative having a cyanovinyl group have a LUMO difference ranging from about 0.2 eV to about 0.7 eV.

10. The organic photoelectric device of claim 1, wherein the quinacridone derivative and the thiophene derivative having a cyanovinyl group are included in the active layer in different ratios depending on their position in relation to the cathode and the anode.

11. The organic photoelectric device of claim 10, wherein the active layer includes a greater amount of the quinacridone derivative when located closer to the anode, and the active layer includes a greater amount of the thiophene derivative having a cyanovinyl group when located closer to the cathode.

12. The organic photoelectric device of claim 1, wherein the quinacridone derivative and the thiophene derivative having a cyanovinyl group are included in a ratio ranging from about 1:100 to about 100:1.

13. The organic photoelectric device of claim 1, wherein the active layer has a thickness ranging from about 1 nm to about 500 nm.

14. The organic photoelectric device of claim 1, further comprising:
a p-type layer between the anode and the active layer, the p-type layer including the quinacridone derivative.

15. The organic photoelectric device of claim 1, further comprising:
an n-type layer between the cathode and the active layer, the n-type layer including the thiophene derivative having a cyanovinyl group.

16. An image sensor comprising the organic photoelectric device according to claim 1.

17. The image sensor of claim 16, wherein the thiophene derivative is represented by the following Chemical Formula 2:

[Chemical Formula 2]

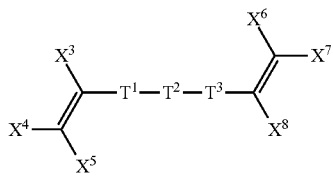

wherein, in Chemical Formula 2,
each of $T^1$, $T^2$, and $T^3$ are independently one of an aromatic ring having a substituted or unsubstituted thiophene moiety,
each of $X^3$ to $X^8$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a cyano group, and a combination thereof, and at least one of $X^3$ to $X^8$ is a cyano group.

18. An active layer for an organic photoelectric device comprising a quinacridone derivative represented by the following Chemical Formula 1 and a thiophene derivative having a cyanovinyl group:

[Chemical Formula 1]

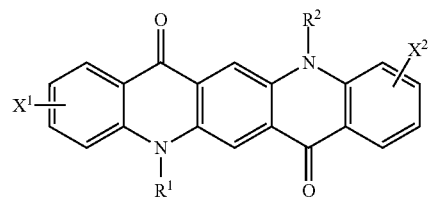

wherein, in Chemical Formula 1,
each of $R^1$ and $R^2$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof, and
each of $X^1$ and $X^2$ are independently one of hydrogen and a substituted or unsubstituted $C_3$ to $C_{30}$ heterocyclic aromatic group, at least one of $X^1$ and $X^2$ is a substituted or unsubstituted $C_3$ to $C_{30}$ heterocyclic aromatic group.

19. The active layer of claim 18, wherein each of $X^1$ and $X^2$ are independently selected from groups listed in the following Group 1:

[Group 1]

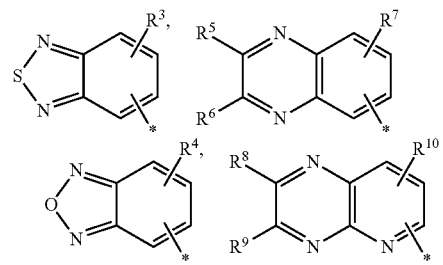

wherein, in Group 1,
each of $R^3$ to $R^{10}$ are independently one of hydrogen, a substituted or unsubstituted C1 to $C_{30}$ alkyl group, a substituted or unsubstituted $C_6$ to $C_{30}$ aryl group, a substituted or unsubstituted $C_3$ to $C_{30}$ heteroaryl group, and a combination thereof.

20. The active layer of claim 18, wherein the thiophene derivative is represented by the following Chemical Formula 2:

[Chemical Formula 2]

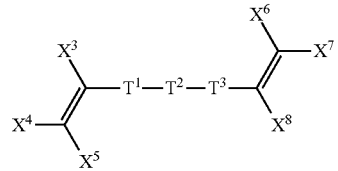

wherein, in Chemical Formula 2,
each of $T^1$, $T^2$, and $T^3$ are independently one of an aromatic ring having a substituted or unsubstituted thiophene moiety, each of $X^3$ to $X^8$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a cyano group, and a combination thereof, and at least one of $X^3$ to $X^8$ is a cyano group.

21. The active layer of claim 20, wherein each of $T^1$, $T^2$, and $T^3$ are independently selected from groups listed in the following Group 2:

[Group 2]

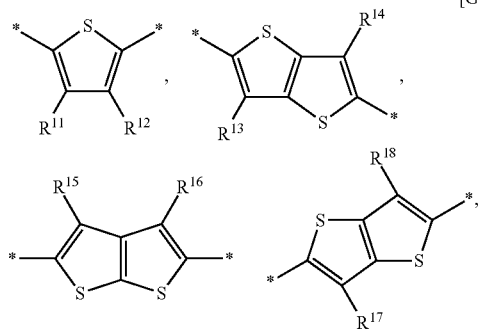

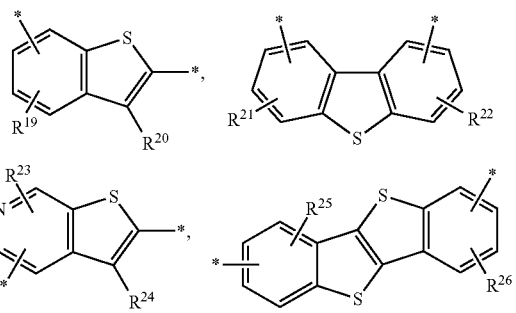

wherein, in Group 2, each of $R^{11}$ to $R^{26}$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

* * * * *